(12) United States Patent
Kim et al.

(10) Patent No.: US 9,985,610 B2
(45) Date of Patent: May 29, 2018

(54) SEMICONDUCTOR DEVICE AND A METHOD OF OPERATING THE SAME

(71) Applicant: SAMSUNG ELECTRONICS CO., LTD., Suwon-si, Gyeonggi-do (KR)

(72) Inventors: Sang Woo Kim, Suwon-si (KR); Suk Nam Kwon, Seongnam-si (KR); Jin Ook Song, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/414,787

(22) Filed: Jan. 25, 2017

(65) Prior Publication Data

US 2017/0214395 A1 Jul. 27, 2017

Related U.S. Application Data

(60) Provisional application No. 62/286,900, filed on Jan. 25, 2016.

(30) Foreign Application Priority Data

Jan. 23, 2017 (KR) ........................ 10-2017-0010427

(51) Int. Cl.
*H03K 3/012* (2006.01)
*H03K 3/037* (2006.01)

(52) U.S. Cl.
CPC ........... *H03K 3/0375* (2013.01); *H03K 3/012* (2013.01)

(58) Field of Classification Search
CPC .................................................... H03K 3/0375
See application file for complete search history.

(56) References Cited

U.S. PATENT DOCUMENTS

| 7,643,368 | B2 | 1/2010 | Choi et al. |
| 7,652,513 | B2 * | 1/2010 | Rao ........................ H03K 3/012 327/203 |
| 7,710,177 | B2 * | 5/2010 | Hoover ............. H03K 3/35625 327/199 |
| 7,948,263 | B2 | 5/2011 | Kim et al. |

(Continued)

FOREIGN PATENT DOCUMENTS

| JP | 2013-251529 | 12/2013 |
| KR | 1020070059626 | 6/2007 |

(Continued)

*Primary Examiner* — Jeffrey Zweizig
(74) *Attorney, Agent, or Firm* — F. Chau & Associates, LLC

(57) ABSTRACT

A semiconductor device includes a power gating circuit including a synchronous reset flip-flop, a retention circuit including a retention flip-flop, a clock management circuit configured to provide an operation clock to the power gating circuit and the retention circuit, and a power management circuit configured to transmit a power gating control signal to the power gating circuit, the retention circuit, and the clock management circuit. The power gating circuit is activated to signal entry to a power reduction mode. The retention circuit retains states of the semiconductor device. Upon exit from the power reduction mode, the power management circuit is configured to complete a reset operation of the power gating circuit before signaling the retention circuit to cancel a retention state and restore the states of the semiconductor device.

20 Claims, 10 Drawing Sheets

(56) References Cited

U.S. PATENT DOCUMENTS

| | | |
|---|---|---|
| 8,013,628 B2 | 9/2011 | Lee et al. |
| 8,289,060 B2 | 10/2012 | Tower et al. |
| 8,456,214 B2 | 6/2013 | Frederick, Jr. |
| 9,007,122 B2 | 4/2015 | Lundberg |
| 9,344,062 B2 | 5/2016 | Miyake |
| 2008/0157842 A1 | 7/2008 | Kim |
| 2012/0200345 A1 | 8/2012 | Kim |
| 2016/0359472 A1 | 12/2016 | Kim |

FOREIGN PATENT DOCUMENTS

| | | |
|---|---|---|
| KR | 10-0850177 | 8/2008 |
| KR | 1020100103195 | 9/2010 |
| KR | 1020110055417 | 5/2011 |
| KR | 1020120090513 | 8/2012 |
| KR | 10-1316788 | 10/2013 |
| KR | 10-1477512 | 12/2014 |

* cited by examiner

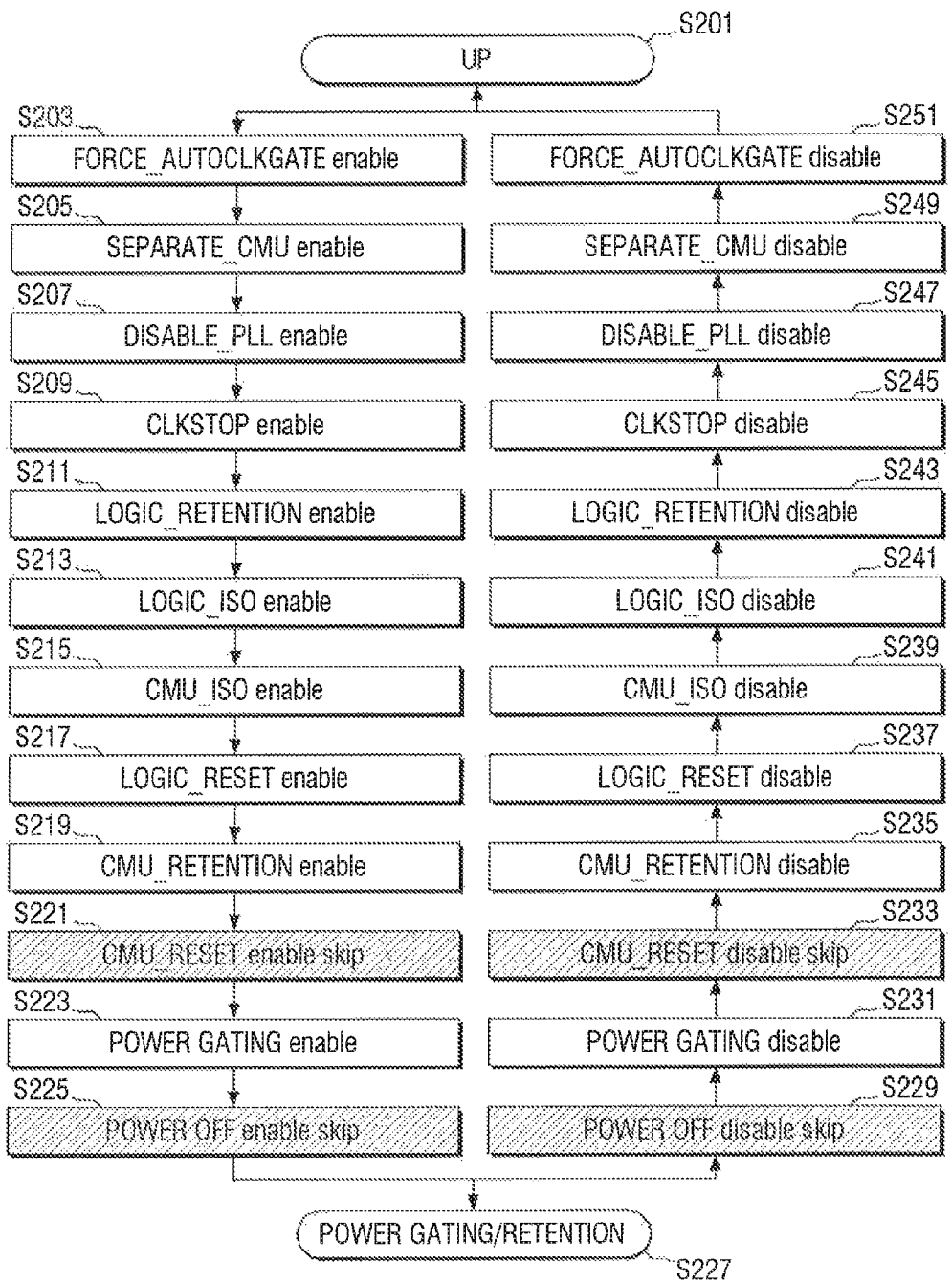

SEMICONDUCTOR DEVICE AND A METHOD OF OPERATING THE SAME

CROSS-REFERENCE TO RELATED APPLICATION

This application claims priority under 35 U.S.C. § 119 to U.S. Provisional Patent Application No. 62/286,900, filed on Jan. 25, 2016 in the United States Patent and Trademark Office, and Korean Patent Application No. 10-2017-0010427, filed on Jan. 23, 2017 in the Korean Intellectual Property Office, the disclosures of which are incorporated by reference herein in their entirety.

TECHNICAL FIELD

Exemplary embodiments of the inventive concept relate to a semiconductor device and a method of operating the same.

DISCUSSION OF RELATED ART

The degree of integration of semiconductor integrated circuits is gradually increasing while the size of semiconductor integrated circuits is decreasing. Generally, as the degree of integration of a semiconductor integrated circuit increases, the magnitude of a power supply voltage supplied to the semiconductor integrated circuit decreases. Accordingly, the semiconductor integrated circuit requires relatively low power to operate. However, the decreased magnitude of the power supply voltage reduces the operating speed of transistors in the semiconductor integrated circuit and thus limits the overall operation performance.

Dynamic threshold voltage technology may be employed with a core circuit in a semiconductor integrated circuit having a complementary metal oxide semiconductor (CMOS) transistor with a low threshold voltage, and a switch circuit, e.g., a power gating circuit, located between the core circuit and a power supply voltage and/or between the core circuit and a ground voltage having a CMOS transistor with a high threshold voltage. Dynamic threshold voltage technology can increase the operating speed and reduce the leakage current of the semiconductor integrated circuit. In other words, in the power gating mode, the leakage current may be reduced by turning off the CMOS transistor of the power gating circuit having the high threshold voltage. In the active mode, high-speed operation of the semiconductor integrated circuit may be ensured by operating the semiconductor circuit to be dependent on the CMOS transistor of the core circuit having the low threshold voltage.

SUMMARY

According to an exemplary embodiment of the inventive concept, a semiconductor device includes a power gating circuit including a synchronous reset flip-flop, a retention circuit including a retention flip-flop, a clock management circuit configured to provide an operation clock to the power gating circuit and the retention circuit, and a power management circuit configured to transmit a power gating control signal to the power gating circuit, the retention circuit, and the clock management circuit. The power gating circuit is activated by signal entry to a power reduction mode. The retention circuit retains states of the semiconductor device. Upon exit from the power reduction mode, the power management circuit is configured to complete a reset operation of the power gating circuit before signaling the retention circuit to cancel a retention state and restore the states of the semiconductor device.

According to an exemplary embodiment of the inventive concept, a semiconductor device includes a first power control block including a first power gating circuit, a first retention circuit, and a first clock management circuit, a second power control block including a second power gating circuit, a second retention circuit, and a second clock management circuit, and a third power control block including a third clock management circuit. The first power control block and the second power control block are connected in parallel with each other at slave level. The third power control block is connected to the first and second power control blocks at a master level. After a power gating operation for the first power control block ends, a normal operation of the first clock management circuit is performed after a reset operation of the first power gating circuit.

According to an exemplary embodiment of the inventive concept, a method of operating a semiconductor device includes resetting a power gating circuit after termination of a power gating operation, canceling a retention state of a retention circuit after resetting the power gating circuit, and maintaining a normal operation of a clock management circuit by canceling the protection of an input of the clock management circuit after the canceling of the retention state of the retention circuit.

According to an exemplary embodiment of the inventive concept, in a method of operating a semiconductor device including a power control block including a clock management circuit, a power gating circuit, and a retention circuit, the method includes enabling an external shutoff signal to isolate the clock management circuit from an external input, enabling a shutoff signal to shut off output of the power control block after enabling the external shutoff signal, and enabling a first reset signal to initialize a state of the power gating circuit after enabling the shutoff signal. The method further includes, after enabling the first reset signal, entering a power reduction mode where a power gating operation and a retention operation are performed by the power gating circuit and the retention circuit, respectively, or entering an external power shutoff mode.

BRIEF DESCRIPTION OF THE DRAWINGS

The above and other features of the inventive concept will become apparent and more readily appreciated by describing in detail exemplary embodiments thereof with reference to the accompanying drawings.

FIGS. 2A and 2B are a timing diagram and a flowchart, respectively, illustrating a retention operation of a retention unit of FIG. 1 and a power gating operation of a power gating unit of FIG. 1 in a power reduction mode according to an exemplary embodiment of the inventive concept.

DETAILED DESCRIPTION OF THE EMBODIMENTS

Figure 1:
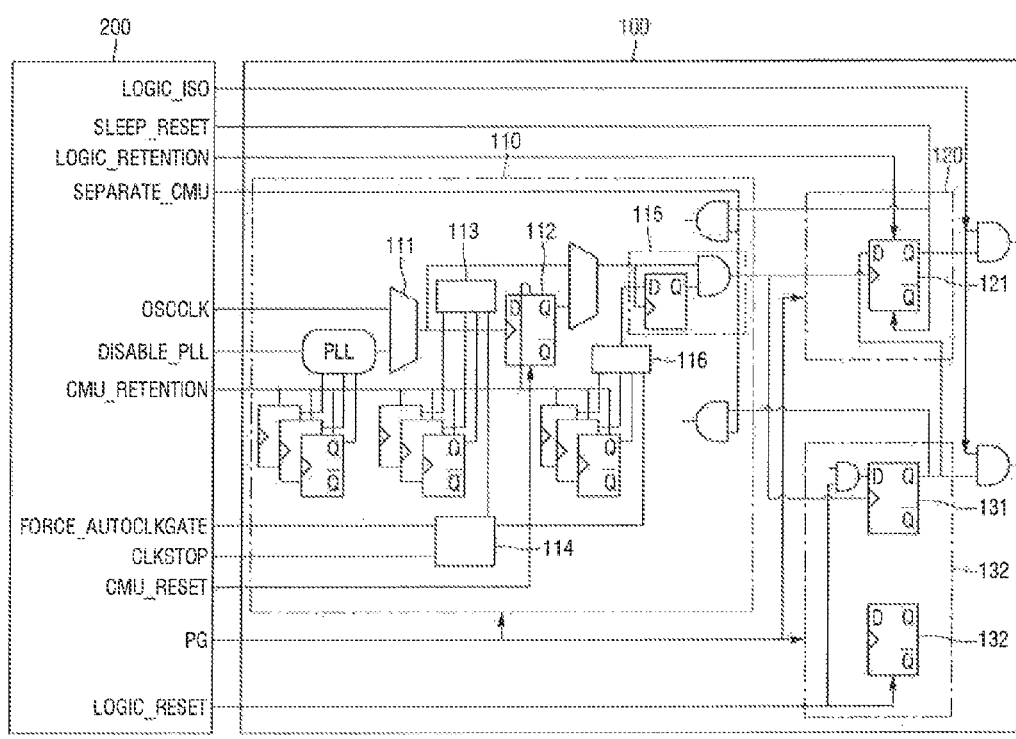
FIG. 1 is a block diagram of a semiconductor device according to an exemplary embodiment of the inventive concept.

Exemplary embodiments of the inventive concept will be described more fully hereinafter with reference to the accompanying drawings. Like reference numerals may refer to like elements throughout this application.

In a case where an exemplary embodiment of the inventive concept is otherwise feasible, functions or operations specified in a particular block may occur in a different order than the order described herein. For example, operations of two successive blocks may be performed substantially at the same time or may be performed in a reverse order depending on a related function or operation.

Exemplary embodiments of the inventive concept provide a semiconductor device that can efficiently control a circuit having various power states using a power gating circuit and a retention circuit, and can prevent the circuit from malfunctioning when performing a normal operation after termination of a power gating operation.

Exemplary embodiments of the inventive concept also provide a method of operating the above-described semiconductor device.

According to an exemplary embodiment of the inventive concept, a power gating method or operation is provided for reducing standby power while a semiconductor device stops operating to reduce the power consumed by the semiconductor device, and a retention method or operation is provided for storing the state of the semiconductor device and restoring the state when the semiconductor device performs a normal operation after termination of a power gating operation. Furthermore, when the operation of the semiconductor device is stopped, the power supplied from an external power device is shut off to reduce standby power.

In particular, according to exemplary embodiments of the inventive concept, a circuit having various power states can be implemented, and the area of the semiconductor device can be reduced by reducing the proportion of the size of a retention circuit to the size of a power gating circuit, where the retention circuit has a relatively larger area compared to the power gating circuit.

In addition, when the circuit is returned to a normal operation mode after the power supplied from the external power device is shut off, the entire circuit may be initialized to ensure the normal operation of the circuit.

Furthermore, a normal operation state of the circuit may be stored in the storage space of the retention circuit during the power gating operation. Then, when a retention signal is deactivated, the normal operation state of the circuit stored in the storage space of the retention circuit may be restored. This can ensure the normal operation of the circuit after the power gating operation.

The internal state of the power gating circuit becomes an unknown state during the power gating operation. Therefore, an initialization operation is required when the power gating circuit returns to the normal operation mode. However, a clock management unit, which provides an operation clock, cannot generate the operation clock during the retention operation. In other words, the clock management unit can generate and supply the operation clock to the power gating circuit only after the retention operation is canceled. In addition, internal circuits of the power gating circuit can operate only after receiving the operation clock from the clock management unit.

An output of a synchronous reset flip-flop of the power gating circuit is in an unknown state before the operation clock is provided to the power gating circuit. If this output is input to the retention circuit, the retention circuit may malfunction. To prevent this, all circuits may be implemented as retention circuits, or the power gating circuit may be composed only of asynchronous reset flip-flops. However, this can increase the area of the semiconductor device.

According to exemplary embodiments of the inventive concept, the clock management unit is isolated from the retention circuit and controlled accordingly. In addition, the clock management unit performs a normal operation before the retention circuit or the power gating circuit. While the clock management unit is performing the normal operation, the retention circuit has not yet returned to the normal operation mode, and thus, an abnormal input may be provided to the clock management unit. Therefore, an input of the clock management unit may be isolated or protected until the output of the synchronous reset flip-flop of the power gating circuit is initialized to the normal operation mode. Accordingly, normal operation of the clock management unit may be ensured.

FIG. 1 is a block diagram of a semiconductor device according to an exemplary embodiment of the inventive concept.

Referring to FIG. 1, the semiconductor device according to an exemplary embodiment of the inventive concept includes a power control block 100 and a power management unit 200.

The power control block 100 may include a clock management unit 110, a retention unit 120, and a power gating unit 130.

The clock management unit 110 may perform a retention operation. The clock management unit 110 may receive a retention control signal CMU_RETENTION from the power management unit 200. However, the inventive concept is not limited thereto, and the clock management unit 110 can also be implemented as a clock management unit without a retention function.

To perform a power gating operation, the clock management unit 110 may receive a power gating control signal PG from the power management unit 200.

The clock management unit 110 may receive a reset signal CMU_RESET from the power management unit 200 to initialize its internal state after the power from an external power device is shut off or after the power gating operation.

To prevent the clock management unit 110 from malfunctioning due to an abnormal input from an external source clock, the clock management unit 110 may receive an external shutoff signal SEPARATE_SMU from the power management unit 200.

The clock management unit 110 may include a clock multiplexer (mux) unit 111, a clock dividing unit 112, a dividing circuit state machine 113, a clock stop state machine 114, a clock gating unit 115, and a clock gating state machine 116.

The clock mux unit 111 may include a control circuit and a clock mux circuit. The control circuit of the clock mux unit 111 may operate with a sequential behavior. The control circuit of the clock mux unit 111 may turn on/off a clock and may generate a first clock request signal to change the selection of the clock mux unit (111) when the clock is off. Additionally, the control circuit of the clock mux unit 111 may transmit the first clock request signal to a clock component being used by the clock mux circuit.

The clock dividing unit 112 may include a control circuit and a clock dividing circuit. The control circuit of the clock dividing unit 112 may operate with a sequential behavior. The control circuit of the clock dividing unit 112 may turn on/off a clock and may generate a second clock request signal to change the clock dividing ratio of the clock dividing circuit when the clock is off.

The dividing circuit state machine 113 may control the state of the clock dividing unit 112.

The clock stop state machine 114 may control a clock stop state and may operate by receiving a clock stop control signal CLKSTOP from the power management unit 200.

The clock gating unit 115 may provide an operation clock to the retention unit 120 and the power gating unit 130, and may perform a clock gating operation. The clock gating operation divides a computer system into small function blocks and prevents dynamic current consumption of unused parts. When a computer is used, not all parts of the computer system are always operated. Therefore, through the clock gating operation, blocks in unused parts of the computer system may be stopped to lower power consumption and reduce the heat generated by these blocks.

The clock gating state machine 116 may control a clock gating state and control the clock gating unit 115 to generate the operation clock or perform the clock gating operation according to the clock gating state.

The retention unit 120 may include a retention flip-flop 121.

The retention unit 120 may perform the retention operation. The retention unit 120 may receive a retention control signal LOGIC_RETENTION from the power management unit 200.

The retention unit 120 may receive the power gating control signal PG from the power management unit 200 to perform the power gating operation when a retention state is maintained.

The retention unit 120 may receive a reset signal SLEEP_RESET from the power management unit 200 to initialize its internal state after the power from the external power device is shut off.

The retention unit 120 may receive the operation clock from the clock management unit 110.

The power gating unit 130 may include flip-flops 131 and 132. For example, the power gating unit 130 may be implemented with a synchronous reset flip-flop.

The power gating unit 130 may receive the power gating control signal PG from the power management unit 200 to perform the power gating operation.

The power gating unit 130 may receive a reset signal LOGIC_RESET from the power management unit 200 to initialize its internal state after the power from the external power device is shut off or after the power gating operation.

The power gating unit 130 may receive the operation clock from the clock management unit 110.

In addition, an output of the power gating unit 130 may be provided as an input to the retention unit 120 or the clock management unit 110.

Likewise, an output of the retention unit 120 may be provided as an input to the power gating unit 130 or the clock management unit 110.

The specific operations of the clock management unit 110, the retention unit 120, and the power gating unit 130 will be described below with reference to FIGS. 2A, 2B, 3A, and 3B.

Figure 2A:
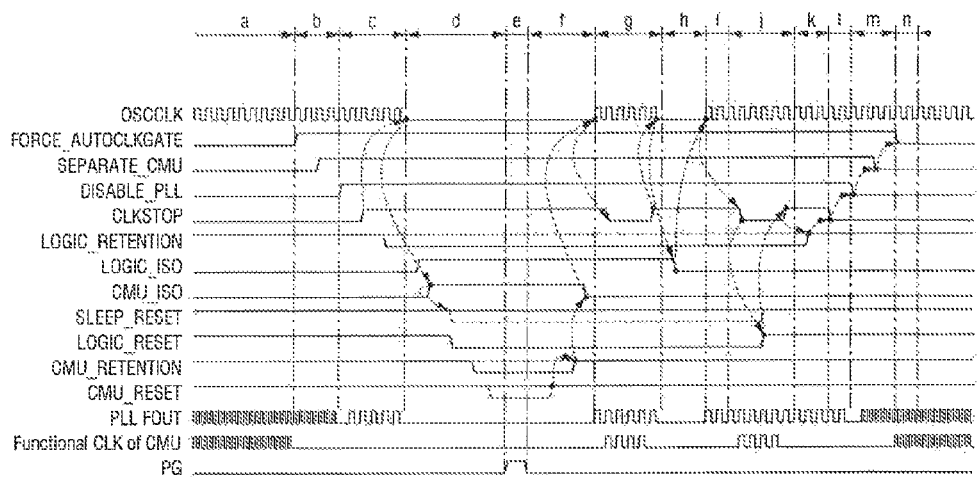

FIGS. 2A and 2B are a timing diagram and a flowchart, respectively, illustrating a retention operation of a retention unit of FIG. 1 and a power gating operation of a power gating unit of FIG. 1 in a power reduction mode according to an exemplary embodiment of the inventive concept.

Referring to FIGS. 2A and 2B, a period e is a period during which the power gating operation is performed or executed (operation S227). During the power gating operation execution period (the period e), the clock management unit 110 is in the retention state. In the power gating operation execution period, the retention control signal CMU_RETENTION for the clock management unit 110 is in a low state. In this example, external power is not shut off, and a disable operation for external power shutoff is skipped (operation S229). After the power gating operation ends (operation S231), the retention control signal CMU_RETENTION transitions to a high state. Accordingly, the retention state of the clock management unit 110 is canceled (operation S235). In this example, a disable operation for the reset signal CMU_RESET is skipped (operation S233).

A shutoff signal CMU_ISO for the clock management unit 110 is disabled (operation S239).

An oscillator clock OSCCLK is provided to the clock management unit 110, and the clock stop control signal CLKSTOP is disabled to resume the operation clock (e.g., functional CLK of CMU), which had been stopped. Accordingly, the clock management unit 110 provides the operation clock to the retention unit 120 and the power gating unit 130. At this time, flip-flops of the power gating unit 130 are initialized.

The operation clock is stopped to disable a shutoff signal LOGIC_ISO for the power control block 100 (operation S241). The clock stop control signal CLKSTOP transitions back to a high state.

After the shutoff signal LOGIC_ISO is disabled, the operation clock is started again. At this time, the initialization operation of the power gating unit 130 is completed, and the reset signal LOGIC_RESET for the power gating unit 130 is disabled (operation S237). The reset signal LOGIC_RESET may be disabled at an earlier time, e.g., before operation S239.

The operation clock is stopped again to cancel the retention operation of the retention unit 120, and the retention control signal LOGIC_RETENTION for the retention unit 120 is disabled (operation S243). Then, the clock stop control signal CLKSTOP is disabled (operation S245) so that the operation clock is started again.

A PLL disable signal DISABLE_PLL is disabled (operation S247) so that a phase locked loop (PLL) is operated again (e.g., as illustrated by PLL FOUT), the external shutoff signal SEPARATE_CMU provided to protect the clock management unit 110 is disabled (operation S249), and a clock gating signal FORCE_AUTOCLKGATE is disabled (operation S251) to perform a normal operation (operation S201).

Referring to FIGS. 2A and 2B, when the power gating operation is initiated, the clock gating signal FORCE_AUTOCLKGATE is enabled (operation S203), the external shutoff signal SEPARATE_CMU provided to protect the clock management unit 110 is enabled (operation S205), and the PLL disable signal DISABLE_PLL is enabled to stop the operation of the PLL (operation S207).

The clock stop control signal CLKSTOP is enabled to stop the output of the clock management unit 110 (operation S209), and the retention control signal LOGIC_RETENTION is enabled to change the state of the retention unit 120 to retention state (operation S211).

The shutoff signal LOGIC_ISO for the power control block 100 is enabled to shut off the output of the power control block 100 (operation S213).

The shutoff signal CMU_ISO for the clock management unit 110 is enabled to shut off the output of the clock management unit 110 (operation S215).

The reset signal LOGIC_RESET for the power gating unit 130 is enabled to initialize the internal state of the power gating unit 130 (operation S217).

The retention control signal CMU_RETENTION for the clock management unit 110 is enabled so that the clock management unit 110 can perform the retention operation (operation S219). An enable operation of the reset signal CMU_RESET is skipped (operation S221). The power gating operation is enabled (operation S223). In this example, external power is on, and thus, an enable operation for external power shutoff is skipped (operation S225). Thus, the power gating operation is performed (operation S227).

Figure 3A:
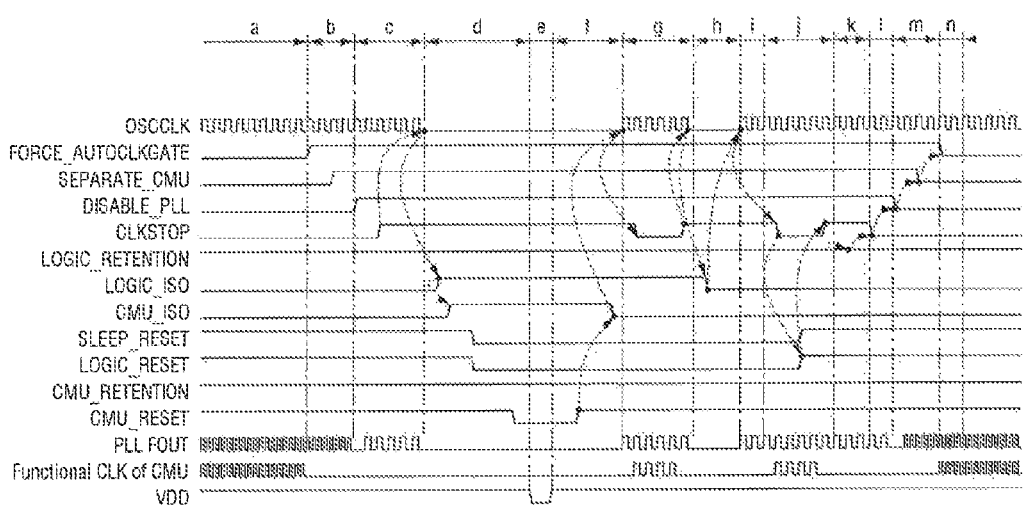
FIGS. 3A and 3B are a timing diagram and a flowchart, respectively, illustrating the retention operation of the retention unit of FIG. 1 and the power gating operation of the power gating unit of FIG. 1 when external power is shut off according to an exemplary embodiment of the inventive concept.
Figure 3B:
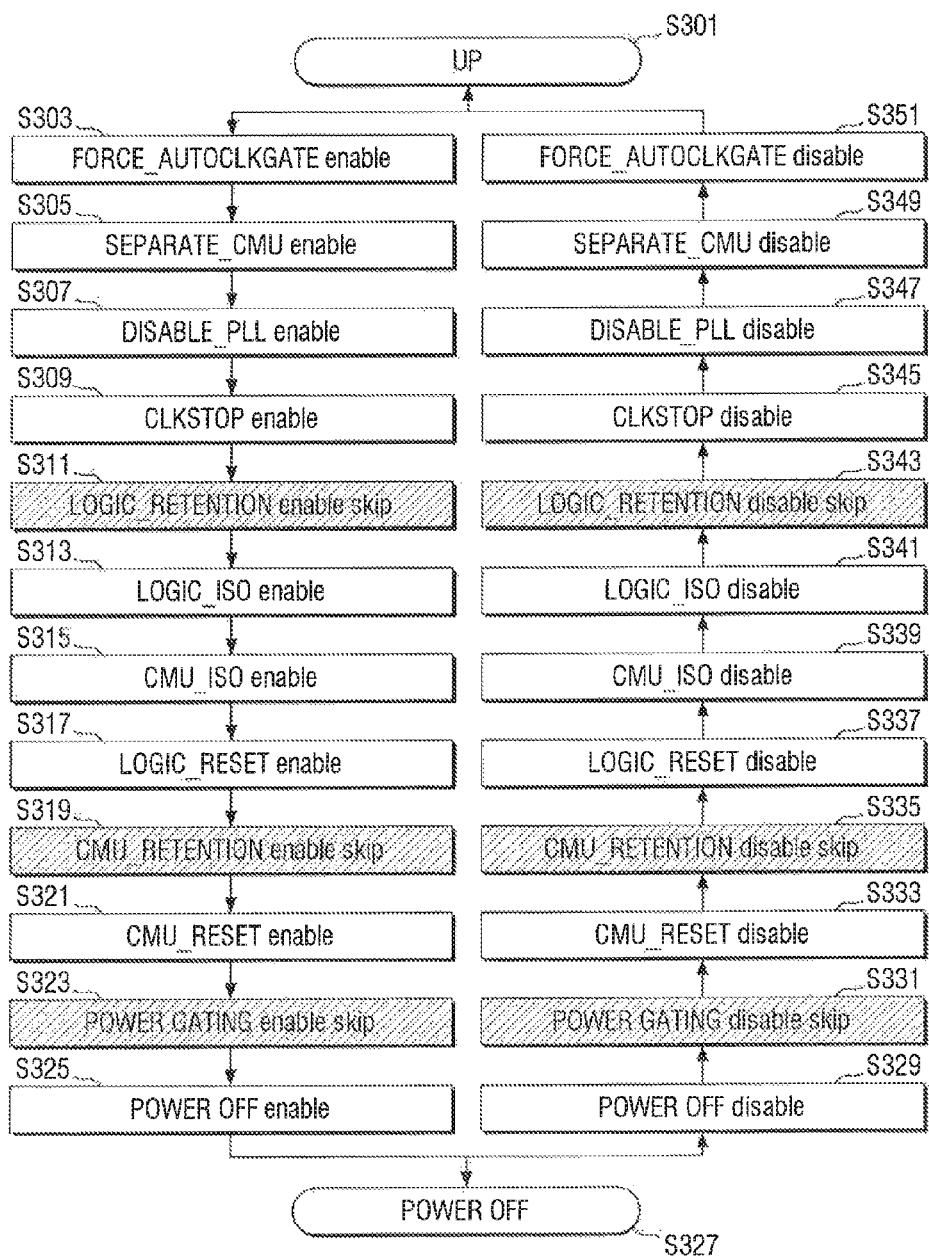

FIGS. 3A and 3B are a timing diagram and a flowchart, respectively, illustrating the retention operation of the retention unit of FIG. 1 and the power gating operation of the power gating unit of FIG. 1 when external power is shut off according to an exemplary embodiment of the inventive concept.

Referring to FIGS. 3A and 3B, the period e is a period during which the external power is shut off (operation S327) (e.g., as illustrated by a power supply voltage VDD). When the external power shutoff is disabled (operation S329), the reset signal CMU_RESET for the clock management unit 110 is disabled (operation S333).

In this example, a disable operation for the power gating operation is skipped (operation S331).

Additionally, a disable operation for the retention control signal CMU_RETENTION is skipped (operation S335).

The shutoff signal CMU_ISO for the clock management unit 110 is disabled (operation S339).

The oscillator clock OSCCLK is provided to the clock management unit 110, and the clock stop control signal CLKSTOP is disabled to resume the operation clock, which had been stopped. Accordingly, the clock management unit 110 provides the operation clock to the retention unit 120 and the power gating unit 130. At this time, the flip-flops of the retention unit 120 and the power gating unit 130 are initialized. The flip-flops of the retention unit 120 have unknown values due to the external power shutoff. However, the unknown values of the flip-flops may be initialized by the reset signal SLEEP_RESET. The clock stop control signal CLKSTOP transitions back to a high state so that the operation clock is stopped to disable the shutoff signal LOGIC_ISO (operation S341) for the power control block 100.

After the shutoff signal LOGIC_ISO for the power control block 100 is disabled, the operation clock is started again. At this time, the initialization operation of the power gating unit 130 is completed, and the reset signal LOGIC_RESET for the power gating unit 130 is disabled (operation S337). The reset signal LOGIC_RESET may be disabled at an earlier time, e.g., before operation S339.

A disable operation for the retention control signal LOGIC_RETENTION is skipped (operation S343).

The operation clock is stopped again, and in this example, the retention control signal LOGIC_RETENTION for the retention unit 120 is maintained in a high state. Then, the clock stop control signal CLKSTOP is disabled so that the operation clock is started again (operation S345).

The PLL disable signal DISABLE_PLL is disabled so that the PLL is operated again (operation S347), the external shutoff signal SEPARATE_CMU provided to protect the clock management unit 110 is disabled (operation S349), and the clock gating signal FORCE_AUTOCLKGATE is disabled (operation S351) to perform a normal operation (operation S301).

Referring to FIGS. 3A and 3B, when the external power shutoff mode is entered, the clock gating signal FORCE_AUTOCLKGATE is enabled (operation S303), the external shutoff signal SEPARATE_CMU provided to protect the clock management unit 110 is enabled (operation S305), and the PLL disable signal DISABLE_PLL is enabled to stop the operation of the PLL (operation S307).

The clock stop control signal CLKSTOP is enabled to stop the output of the clock management unit 110 (operation S309).

An enable operation for the retention control signal LOGIC_RETENTION is skipped (operation S311).

The shutoff signal LOGIC_ISO for the power control block 100 is enabled to shut off the output of the power control block 100 (operation S313).

The shutoff signal CMU_ISO for the clock management unit 110 is enabled to shut off the output of the clock management unit 110 (operation S315).

The reset signal LOGIC_RESET for the power gating unit 130 is enabled to initialize the internal state of the power gating unit 130 (operation S317).

An enable operation for the retention control signal CMU_RETENTION is skipped (operation S319).

The reset signal CMU_RESET for the clock management unit 110 is enabled so that the clock management unit 110 can perform an initialization operation (operation S321).

An enable operation to initiate the power gating operation is skipped (operation S323).

External power shutoff is enabled (operation S325) so that the external power is shut off (operation S327).

According to an exemplary embodiment of the inventive concept, when the power gating operation is canceled, it is possible to prevent the retention unit 120 from receiving an input of an unknown state due to an uninitialized output of the synchronous reset flip-flop 131 of the power gating unit 130. For example, before the retention control signal LOGIC_RETENTION for the retention unit 120 is disabled, the reset signal LOGIC_RESET for the power gating unit 130 is enabled (low state), and, at substantially the same time, the operation clock is received from the clock management unit 110.

If the output of the power gating unit 130 that has not been initialized or the output of the retention unit 120 that has not been restored to a normal operating state is provided as an input to the clock management unit 110, the clock management unit 110 may malfunction. To prevent this, according to an exemplary embodiment of the inventive concept, the initialization operation of the power gating unit 130 or the restoration operation of the retention unit 120 from the retention state to the normal operating state is performed before the external shutoff signal SEPARATE_CMU, for protecting the clock management unit 110 from an external input, is disabled. This can ensure the stable operation of the clock management unit 110.

Figure 4:
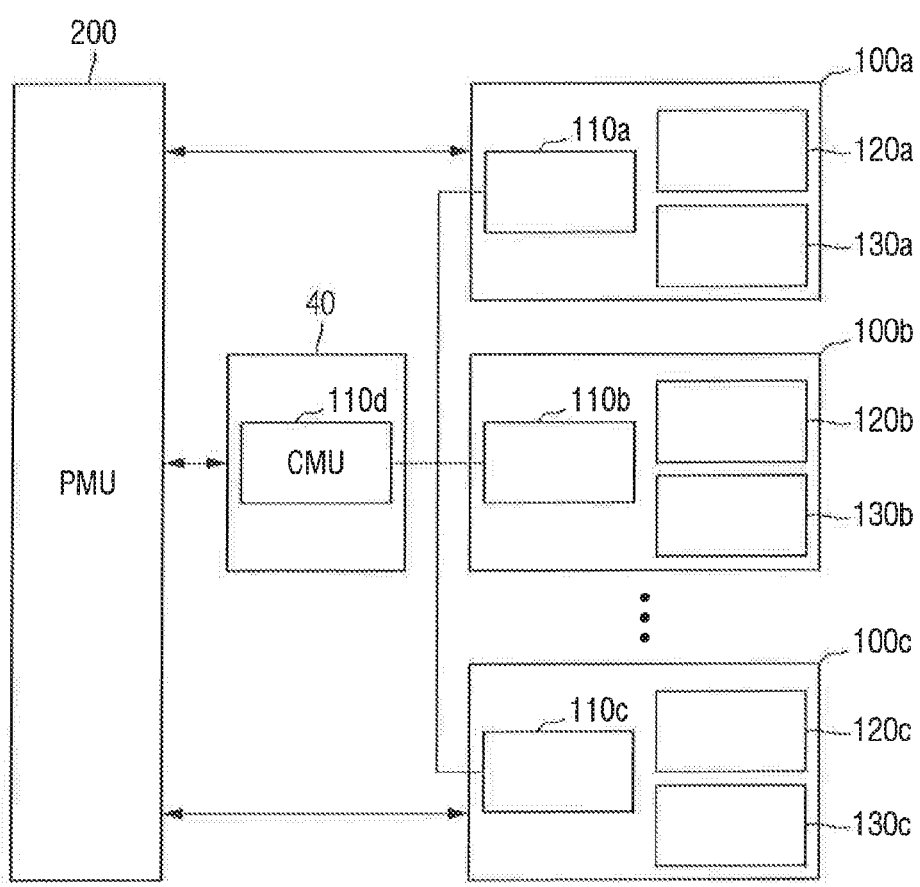
FIG. 4 is a block diagram of a semiconductor device according to an exemplary embodiment of the inventive concept.

FIG. 4 is a block diagram of a semiconductor device according to an exemplary embodiment of the inventive concept.

Referring to FIG. 4, the semiconductor device according to an exemplary embodiment of the inventive concept includes a main block 40, a plurality of power control blocks 100a through 100c, and a power management unit 200.

Each of the power control blocks 100a through 100c may have substantially the same configuration as the power control block 100 described above with reference to FIG. 1.

The power control blocks 100a through 100c may include clock management units 110a through 110c, retention units 120a through 120c, and power gating units 130a through 130c, respectively.

The main block 40 may provide the operation clock to each of the power control blocks 100a through 100c. The main block 40 includes a clock management unit 110d but does not include a retention unit or a power gating unit.

The main block 40 may operate to generate the operation clock, and the shutoff signal CMU_ISO for the main block 40 may be disabled before the shutoff signal LOGIC_ISO for the power control blocks 100a through 100c. In addition, the operation of the main block 40 may continue after the operation of the power control blocks 100a through 100c.

Figure 5:
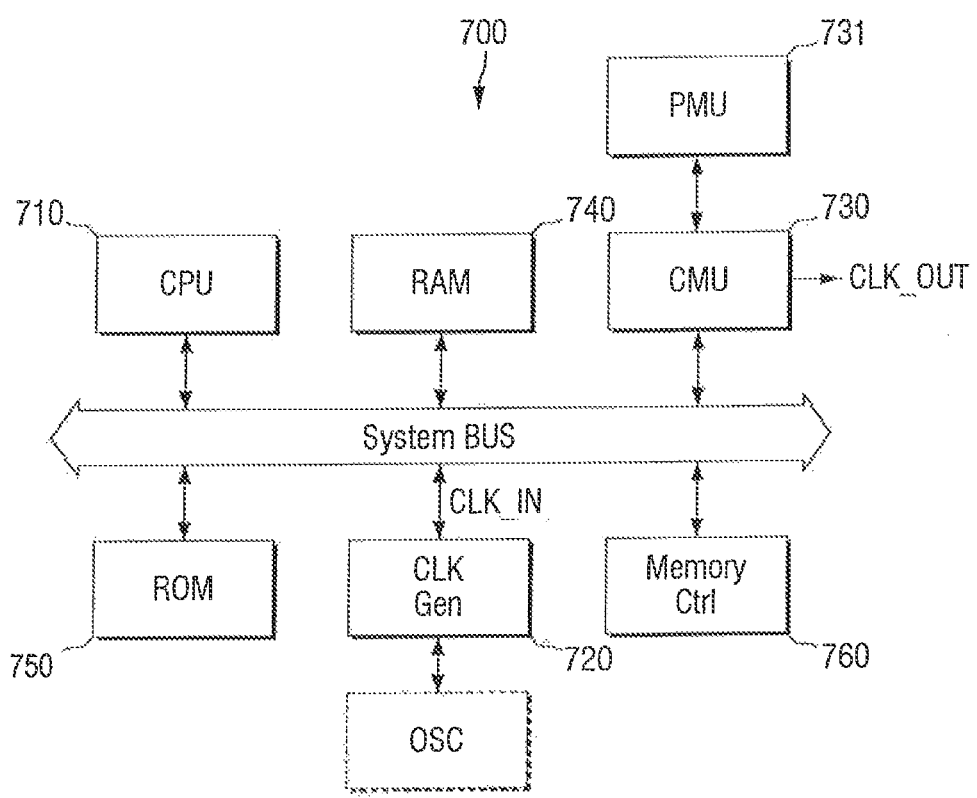
FIG. 5 is a block diagram of a system on chip (SoC) including a semiconductor device according to an exemplary embodiment of the inventive concept.

FIG. 5 is a block diagram of a system on chip (SoC) including a semiconductor device according to an exemplary embodiment of the inventive concept.

Referring to FIG. 5, a SoC 700 may include a central processing unit (CPU) 710, a clock generator 720, a clock management unit 730, a random access memory (RAM) 740, a read only memory (ROM) 750, and a memory control module 760, which may be connected to one another via a system bus. The clock management unit 730 may correspond to the clock management unit 110 of FIG. 1. The SoC 700 may further include a power management unit 731, which corresponds to the power management unit 200 of FIG. 1. An oscillator OSC may be disposed outside the SoC 700 and provide an oscillation signal to the SoC 700. However, this is merely an example, and the SoC 700 may include other various function blocks and/or the oscillator OSC may be provided within the SoC 700. The SoC 700 of FIG. 5 may be provided in a semiconductor system as an application processor.

The clock generator 720 generates a reference clock signal CLK_IN having a reference frequency using the oscillation signal from the oscillator OSC. The clock management unit 730 may receive the reference clock signal CLK_IN, generate an operation clock signal CLK_OUT having a predetermined frequency, and provide the operation clock signal CLK_OUT to each function block. The clock management unit 730 may include one or more clock controllers, such as master clock controllers and slave clock controllers. Each of the clock controllers may generate the operation clock signal CLK_OUT using the reference clock signal CLK_IN.

In addition, the clock controllers in the clock management unit 730 may be connected through a channel to manage clock signals through hardware. The clock controllers in the clock management unit 730 may also be connected to the function blocks through a channel to perform a clock request and a request response through hardware.

The CPU 710 may process or execute codes and/or data stored in the RAM 740. For example, the CPU 710 may process or execute the codes and/or the data in response to the operation clock output from the clock management unit 730. The CPU 710 may be implemented as a multi-core processor. The multi-core processor is a computing component having two or more independent processors, each capable of reading and executing program instructions. The multi-core processor can simultaneously drive a plurality of accelerators. Therefore, a data processing system including the multi-core processor can perform multi-acceleration.

The RAM 740 may temporarily store program codes, data, or instructions. For example, program codes and/or data stored in an internal or external memory may be temporarily stored in the RAM 740 according to the control of the CPU 710 or booting code stored in the ROM 750. The memory control module 760 is a block for interfacing with the internal or external memory. The memory control module 760 controls overall operation of the internal or external memory and also controls all data exchanges between a host and the internal or external memory.

Figure 6:
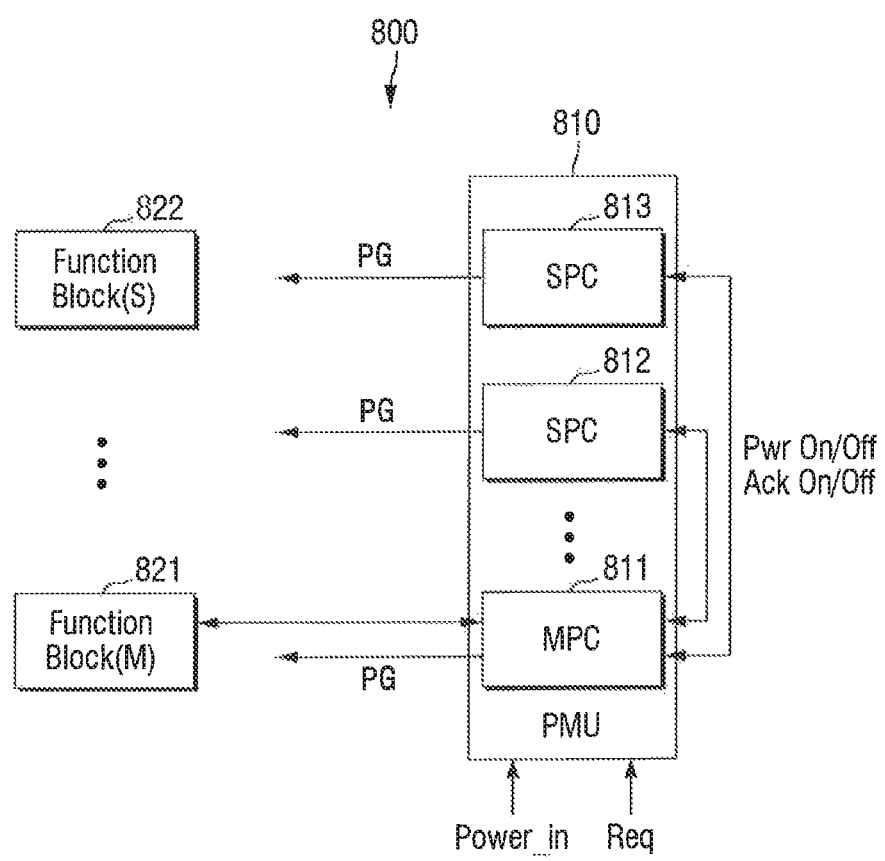
FIG. 6 is a block diagram of a SoC including a semiconductor device according to an exemplary embodiment of the inventive concept.

FIG. 6 is a block diagram of a SoC including a semiconductor device according to an exemplary embodiment of the inventive concept.

Referring to FIG. 6, a SoC 800 includes a power management unit 810 which manages power supply to function blocks. The power management unit 810 may be designed to manage the power used within the SoC 800.

The SoC 800 further includes a plurality of function blocks 821 and 822. The function blocks 821 and 822 may be classified as a master function block 821 and slave function blocks 822. For the master function block 821 to operate, power should be supplied to the master function block 821 and also to one or more slave function blocks 822 related to the operation of the master function block 821.

Within the power management unit 810, a master power controller 811 may communicate with each of slave power controllers 812 and 813 through a channel. The power management unit 810 may receive input power Power_in and generate output power Power_out by adjusting and converting the input power Power_in to suit each function block. In addition, the power management unit 810 may provide power or block the supply of power to the master function block 821 and the slave function blocks 822 according to a power request Req. Each of the master power controller 811 and the slave power controllers 812 and 813 may provide the power gating control signal PG to the master function block 821 and the slave function blocks 822.

The master power controller 811 may receive the power request Req through software based on the code processing of a central processing unit, or receive the power request Req from the master function block 821 through hardware. The master function block 821 may provide a power on/off command Pwr On/Off to the slave power controllers 812 and 813, and receive a power response Ack On/Off from the slave power controllers 812 and 813, via the master power controller 811.

Figure 7:
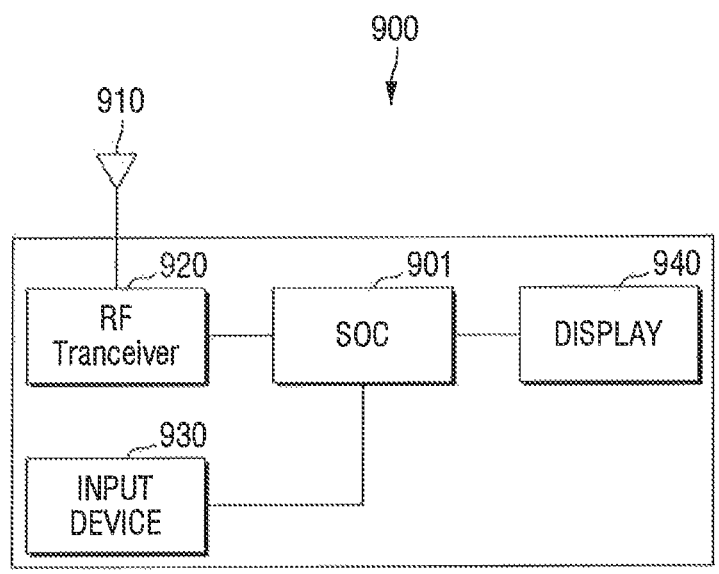
FIG. 7 is a block diagram of a semiconductor system including a SoC according to an exemplary embodiment of the inventive concept.

FIG. 7 is a block diagram of a semiconductor system including a SoC according to an exemplary embodiment of the inventive concept.

Referring to FIG. 7, a semiconductor system 900 may include a SoC 901 according to the above-described exemplary embodiments, an antenna 910, a wireless transceiver 920, an input device 930, and a display 940. The wireless transceiver 920 may transmit or receive a radio signal via the antenna 910. For example, the wireless transceiver 920 may change a radio signal received via the antenna 910 to a signal that can be processed by the SoC 901.

Thus, the SoC 901 may process the signal output from the wireless transceiver 920 and transmit the processed signal to the display 940. In addition, the wireless transceiver 920 may convert a signal output from the SoC 901 into a radio signal and output the radio signal to an external device via the antenna 910. The input device 930 is a device used to input a control signal for controlling the operation of the SoC 901 or data to be processed by the SoC 901. The input device 930 may be implemented as a pointing device such as a touch pad or a computer mouse, a keypad, a keyboard, etc.

Figure 8:
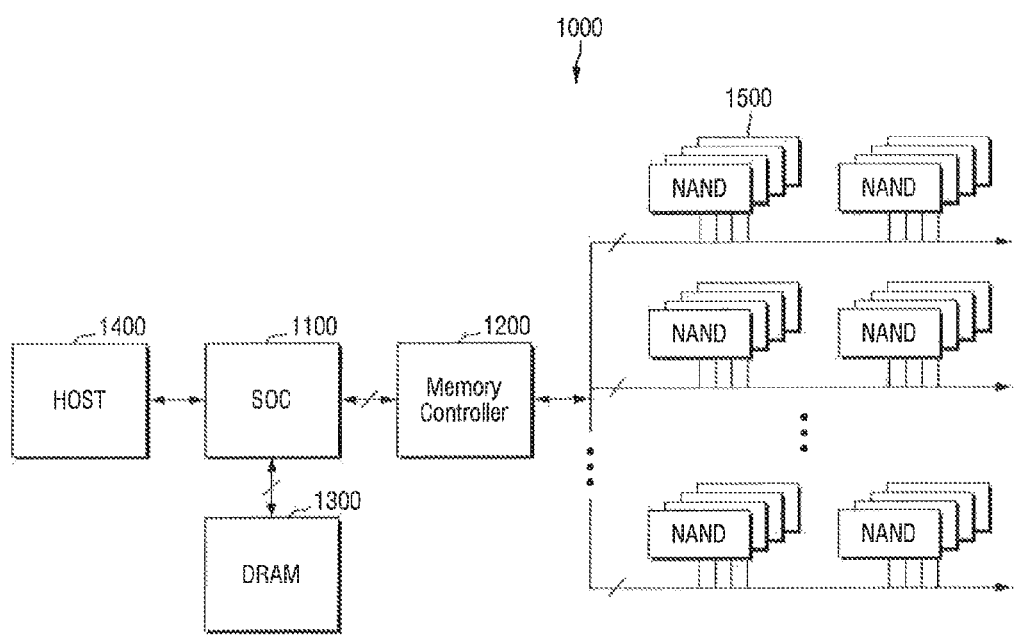
FIG. 8 is a block diagram of a semiconductor system including a SoC according to an exemplary embodiment of the inventive concept.

FIG. 8 is a block diagram of a semiconductor system including a SoC according to an exemplary embodiment of the inventive concept.

Referring to FIG. 8, a semiconductor system may include a memory system 1000, and the memory system 1000 may be implemented as a data processing device such as a solid state drive (SSD). The memory system 1000 may include a plurality of memory devices 1500, a memory controller 1200 which can control the data processing operation of each of the plurality of memory devices 1500, a volatile memory device 1300 such as a dynamic random access memory (DRAM), and a SoC 1100 which controls data exchanged between the memory controller 1200 and a host 1400 and stored in the volatile memory device 1300. The SoC 1100 may be implemented according to the above-described exemplary embodiments.

While the inventive concept has been illustrated and described with reference to exemplary embodiments thereof, it will be understood by those of ordinary skill in the art that various changes in form and details may be made thereto without departing from the spirit and scope of the inventive concept as defined by the following claims.

What is claimed is:

1. A semiconductor device comprising:
    a power gating circuit comprising a synchronous reset flip-flop, wherein the power gating circuit is activated to signal entry to a power reduction mode;
    a retention circuit comprising a retention flip-flop, wherein the retention circuit retains states of the semiconductor device;
    a clock management circuit configured to provide an operation clock to the power gating circuit and the retention circuit; and
    a power management circuit configured to transmit a power gating control signal to the power gating circuit, the retention circuit, and the clock management circuit,
    wherein upon exit from the power reduction mode, the power management circuit is configured to complete a reset operation of the power gating circuit before signaling the retention circuit to cancel a retention state and restore the states of the semiconductor device.

2. The semiconductor device of claim 1, wherein the power management circuit provides a reset signal to the power gating circuit, and the clock management circuit provides the operation clock to the power gating circuit at substantially the same time as the reset signal is provided to the power gating circuit.

3. The semiconductor device of claim 1, wherein the power management circuit transmits an external shutoff signal to the clock management circuit to block provision of an external input to the clock management circuit.

4. The semiconductor device of claim 3, wherein the external shutoff signal is deactivated after the reset operation of the power gating circuit.

5. The semiconductor device of claim 4, wherein the power management circuit provides a retention control signal to the retention circuit such that the retention circuit maintains the retention state.

6. The semiconductor device of claim 5, wherein the external shutoff signal is deactivated after the retention control signal is deactivated.

7. The semiconductor device of claim 1, wherein after termination of a power gating operation, the power management circuit provides a first reset signal to the power gating circuit to initialize a state of the power gating circuit and provides a second reset signal to the retention circuit to initialize a state of the retention circuit.

8. The semiconductor device of claim 7, wherein the first reset signal and the second reset signal are provided at substantially the same time.

9. The semiconductor device of claim 1, wherein an output of the power gating circuit is provided as an input to the retention circuit and an input to the clock management circuit.

10. The semiconductor device of claim 1, wherein an output of the retention circuit is provided as an input to the power gating circuit and an input to the clock management circuit.

11. A semiconductor device comprising:
    a first power control block comprising a first power gating circuit, a first retention circuit, and a first clock management circuit;
    a second power control block comprising a second power gating circuit, a second retention circuit, and a second clock management circuit; and
    a third power control block comprising a third clock management circuit,
    wherein the first power control block and the second power control block are connected in parallel with each other at a slave level,
    the third power control block is connected to the first and second power control blocks at a master level, and
    after a power gating operation for the first power control block ends, a normal operation of the first clock management circuit is performed after a reset operation of the first power gating circuit.

12. The semiconductor device of claim 11, wherein the reset operation of the first power gating circuit is performed before a retention state of the first retention circuit is canceled.

13. The semiconductor device of claim 11, further comprising a protection circuit configured to maintain the normal operation of the first clock management circuit until a retention state of the first retention circuit is canceled.

14. The semiconductor device of claim 13, wherein an input of the first clock management circuit is protected until the retention state of the first retention circuit is restored.

15. The semiconductor device of claim 11, wherein a reset signal is provided to the first power gating circuit and an operation clock is provided to the first power gating circuit at substantially the same time.

16. The semiconductor device of claim 11, wherein the third power control block controls an operation block provided to the first and second power control blocks.

17. The semiconductor device of claim 11, wherein a first reset signal is provided to the first power gating circuit to initialize a state of the first power gating circuit, and a second reset signal is provided to the first retention circuit to initialize a state of the first retention circuit.

18. The semiconductor device of claim 17, wherein the first reset signal and the second reset signal are provided at substantially the same time.

19. A method of operating a semiconductor device, the method comprising:
    resetting a power gating circuit after termination of a power gating operation;
    canceling a retention state of a retention circuit after resetting the power gating circuit; and maintaining a normal operation of a clock management circuit by canceling the protection of an input of the clock management circuit after the canceling the retention state of the retention circuit.

20. The method of claim 19, wherein an operation clock is provided to the power gating circuit at substantially the same time as the resetting of the power gating circuit.

\* \* \* \* \*